(12) United States Patent
Chen

(10) Patent No.: US 11,694,999 B2
(45) Date of Patent: Jul. 4, 2023

(54) ELECTRONIC DEVICE AND FABRICATION METHOD THEREOF

(71) Applicant: Innolux Corporation, Miao-Li County (TW)

(72) Inventor: Yeong-E Chen, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 243 days.

(21) Appl. No.: 17/083,318

(22) Filed: Oct. 29, 2020

(65) Prior Publication Data

US 2021/0335764 A1    Oct. 28, 2021

(30) Foreign Application Priority Data

Apr. 28, 2020    (CN) .......................... 202010350313.5

(51) Int. Cl.
| | |
|---|---|
| H01L 25/16 | (2023.01) |
| H01L 25/04 | (2023.01) |
| H01L 31/02 | (2006.01) |
| H01L 25/075 | (2006.01) |
| H01L 33/62 | (2010.01) |
| H01L 23/538 | (2006.01) |
| H01L 31/18 | (2006.01) |

(52) U.S. Cl.
CPC ........ *H01L 25/167* (2013.01); *H01L 23/5386* (2013.01); *H01L 25/042* (2013.01); *H01L 25/0753* (2013.01); *H01L 31/02005* (2013.01); *H01L 31/1892* (2013.01); *H01L 33/62* (2013.01); *H01L 2933/0066* (2013.01)

(58) Field of Classification Search
CPC ............. H01L 24/19–20; H01L 25/042; H01L 25/0753; H01L 23/538; H01L 23/5381; H01L 23/5383; H01L 23/5384; H01L 23/5385; H01L 23/5386; H01L 23/5389
See application file for complete search history.

(56) References Cited

U.S. PATENT DOCUMENTS

2017/0207208 A1* 7/2017 Chen ................... H01L 23/3114

FOREIGN PATENT DOCUMENTS

| CN | 107026154 | 8/2017 |
|---|---|---|
| TW | M515202 | 1/2016 |

\* cited by examiner

*Primary Examiner* — Tucker J Wright
(74) *Attorney, Agent, or Firm* — JCIPRNET

(57) ABSTRACT

An electronic device and a fabrication method thereof are provided. The electronic device includes a circuit structure layer, a package structure, an electronic element, and a plurality of function elements. The circuit structure layer has a first side and a second side opposite to the first side. The package structure is disposed on the first side of the circuit structure layer. The electronic element is embedded or encapsulated in the package structure. The function elements are disposed on the second side of the circuit structure layer. The function elements are electrically connected to the electronic element through the circuit structure layer. The electronic device provided by the disclosure exhibits borderless design or has a large function region.

18 Claims, 8 Drawing Sheets

ELECTRONIC DEVICE AND FABRICATION METHOD THEREOF

CROSS-REFERENCE TO RELATED APPLICATION

This application claims the priority benefit of China application serial no. 202010350313.5, filed on Apr. 28, 2020. The entirety of the abovementioned patent application is hereby incorporated by reference herein and made a part of this specification.

BACKGROUND

Technical Field

The disclosure relates to an electronic device and a fabrication method, and in particular, to an electronic device exhibiting a borderless design or having a large function region.

Description of Related Art

With the vigorous development of the electronic products, the electronic devices are required to continuously facilitate development of the electronic products towards providing narrow border designs, borderless designs, large function regions (e.g., display regions), or high resolutions. Therefore, technologies applied to the electronic products need to be continuously enhanced.

SUMMARY

The disclosure provides an electronic device exhibiting a borderless design or having a large function region.

The disclosure further provides a fabrication method of an electronic device capable of fabricating the above electronic device.

According to an embodiment of the disclosure, an electronic device includes a circuit structure layer, a package structure, an electronic element, and a plurality of function elements. The circuit structure layer has a first side and a second side opposite to the first side. The package structure is disposed on the first side of the circuit structure layer. The electronic element is embedded or encapsulated in the package structure. The function elements are disposed on the second side of the circuit structure layer. The function elements are electrically connected to the electronic element through the circuit structure layer.

According to an embodiment of the disclosure, a fabrication method of an electronic device includes the following steps. First, a circuit structure layer is arranged on a carrier substrate. The circuit structure layer has a first side and a second side opposite to the first side. Next, an electronic element is disposed on the first side of the circuit structure layer. Afterward, a package structure is disposed on the electronic element and the first side of the circuit structure layer. The electronic element is embedded or encapsulated in the package structure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
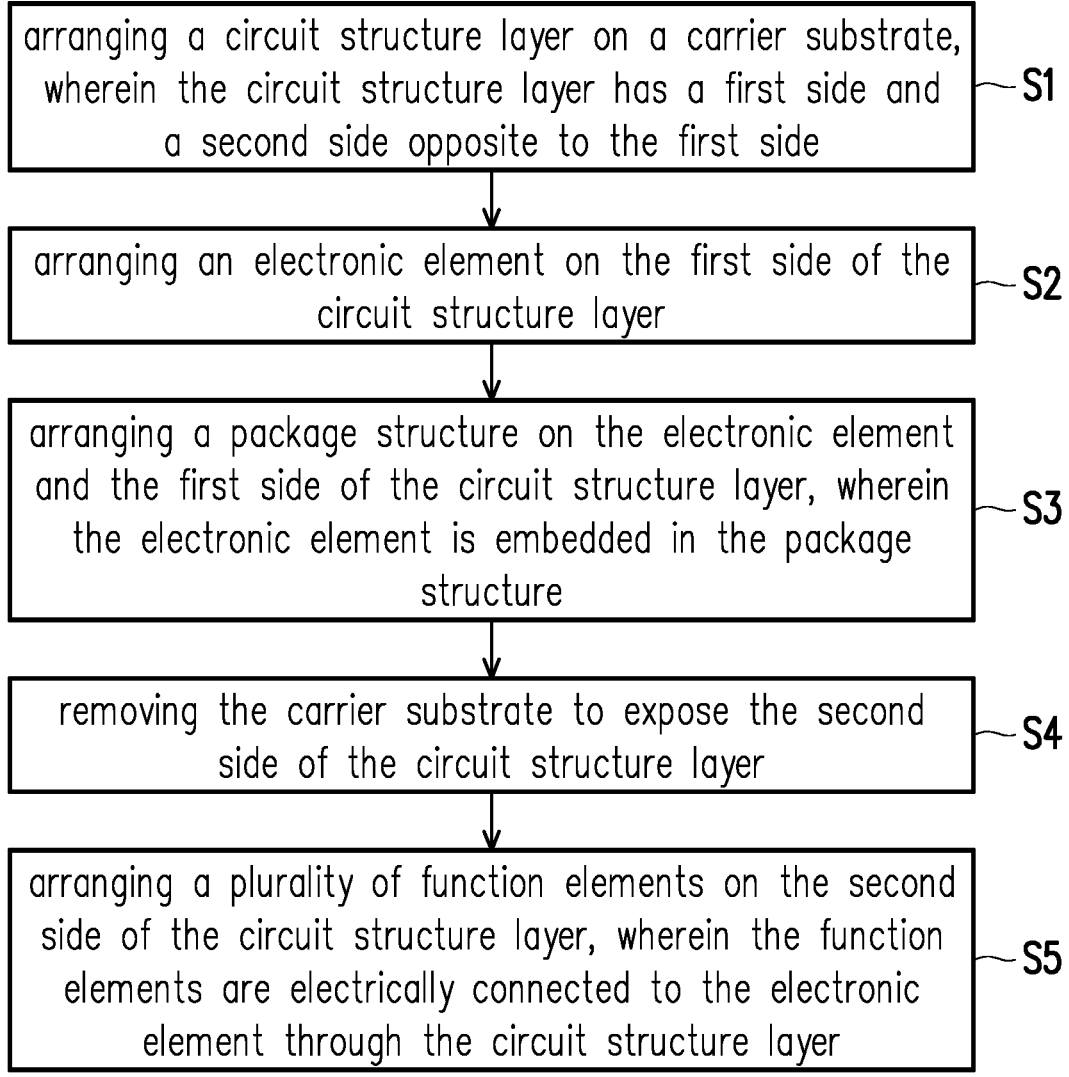
FIG. 1 is a flow chart of a fabrication method of an electronic device according to an embodiment of the disclosure.

The accompanying drawings are included together with the detailed description provided below to provide a further understanding of the disclosure. Note that in order to make the accompanying drawings to be more comprehensible to readers and for the sake of clarity of the accompanying drawings, only part of the electronic device is depicted in the accompanying drawings of the disclosure, and specific elements in the drawings are not depicted according to actual scales. In addition, the numbers and sizes of the elements in each drawing are provided for illustration only and are not used to limit the scope of the disclosure.

In the following specification and claims, the words "comprising", "including" or "having" are open-ended words and therefore should be interpreted as "containing but not limited to . . . ".

It should be understood that when an element or a film layer is referred to as being "on" or "connected to" another element or film layer, it can be directly on the another element or film layer or be directly connected to the another element or film layer, or an inserted element or film layer may be provided therebetween (not a direct connection). In contrast, when the element is referred to as being "directly on" another element or film layer or "directly connected to" another element or film layer, an inserted element or film layer is not provided therebetween.

In some embodiments of the disclosure, regarding the words such as "connected", "interconnected", etc. referring to bonding and connection, unless specifically defined, these words mean that two structures are in direct contact or two structures are not in direct contact, and other structures are provided to be disposed between the two structures. The word for joining and connecting may also include the case where both structures are movable or both structures are fixed. In addition, the word "coupled" may include any direct or indirect electrical connection means.

The terms "about", "equal to", "identical" or "same", "substantially", or "approximately" are generally interpreted as being within 20% of a given value or range or are interpreted as being within 10%, 5%, 3%, 2%, 1%, or 0.5% of a given value or range.

The ordinal numbers used in the specification and claims, such as "first", "second", etc., are used to modify the elements, and they do not imply or represent the (or these) elements have any previous ordinal numbers, do not represent the order of an element and another element, or the order of a fabrication method. The use of these ordinal numbers is only used to clearly distinguish an element with a certain name from another element with the same name.

The terms used in the claims and the specification may not have to be the same, and accordingly, the first member provided in the specification may be the second member in the claims.

In the disclosure, the thickness, the length, and the width may be measured by an optical microscope, and the thickness may be measured from a cross-sectional image in an electron microscope, but it is not limited thereto. In addition, an error may be provided between any two values or directions used for comparison. If the first value is equal to the second value, it implies that an error of approximately 10% is provided between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

Unless otherwise defined, all terms (including technical and scientific terms) used herein have the same meaning as commonly understood by a person of ordinary skill in the art. It will be further understood these terms, such as those defined in commonly used dictionaries, should be interpreted as having meaning that is consistent with their meaning in the context of the related art and the disclosure and should not be interpreted in an idealized or overly formal sense unless expressly so defined herein.

It should be understood that in the following embodiments, the features of several different embodiments may be replaced, recombined, and mixed to complete other embodiments without departing from the spirit of the disclosure. As long as the features of the embodiments do not violate or do not conflict with the spirit of the disclosure, they may be mixed and matched arbitrarily.

The electronic device may include a display device, an antenna device (such as a liquid crystal antenna), a sensing device, a light emitting device, a touch device, or a tiling device, but it is not limited. The electronic device may include a bendable and flexible electronic device. The appearance of the electronic device may be rectangular, circular, polygonal, or a shape with curved edges, or other suitable shapes. The electronic device may include a light emitting diode, liquid crystal, fluorescence, or phosphor material, other suitable materials, or a combination of the above material, but it is not limited. The light emitting diode may include but not limited to an organic light emitting diode (OLED), an inorganic light emitting diode (LED), a mini LED, a micro LED, or a quantum dot (QD) LED (e.g., QLED and QDLED), other suitable materials, or a combination of the above, but it is not limited. Note that the electronic device may be any combination of the above. It should be understood that in the following embodiments, the features of several different embodiments may be replaced, recombined, and mixed to complete other embodiments without departing from the spirit of the disclosure. As long as the features of the embodiments do not violate or do not conflict with the spirit of the disclosure, they may be mixed and matched arbitrarily.

Descriptions of the disclosure are given with reference to the exemplary embodiments illustrated by the accompanying drawings. Wherever possible, the same reference numbers are used in the drawings and the description to refer to the same or like parts.

FIG. 1 is a flow chart of a fabrication method of an electronic device according to an embodiment of the disclosure. FIG. 2A to FIG. 2D are cross-sectional schematic views of the fabrication method of the electronic device according to an embodiment of the disclosure. FIG. 3 is a three-dimensional schematic view of the electronic device of FIG. 2D. For clarity of the accompanying drawings and convenience of description, several elements in the electronic device are omitted in FIG. 3.

Figure 2A:
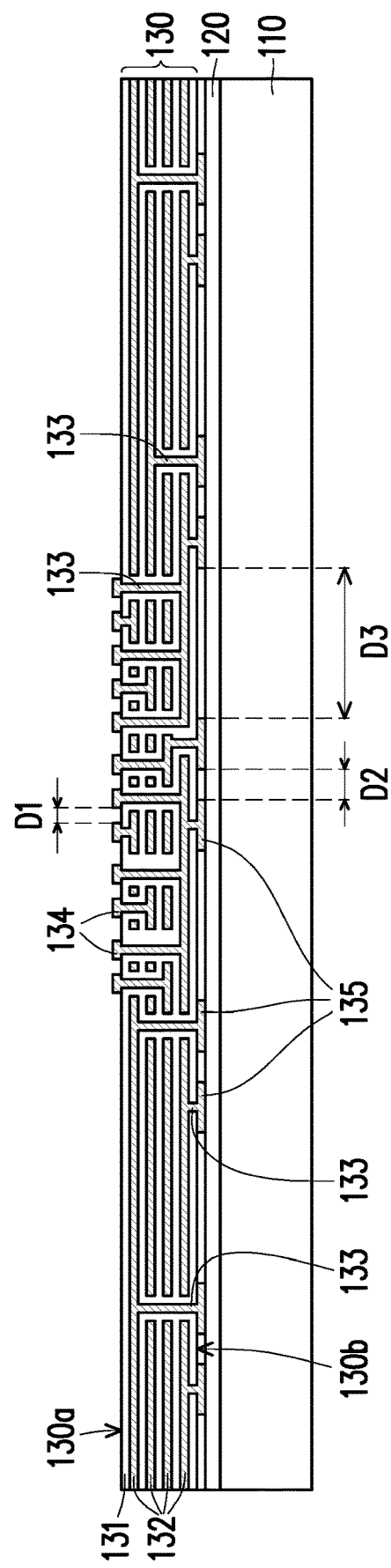
FIG. 2A to FIG. 2D are cross-sectional schematic views of the fabrication method of the electronic device according to an embodiment of the disclosure.
Figure 3:
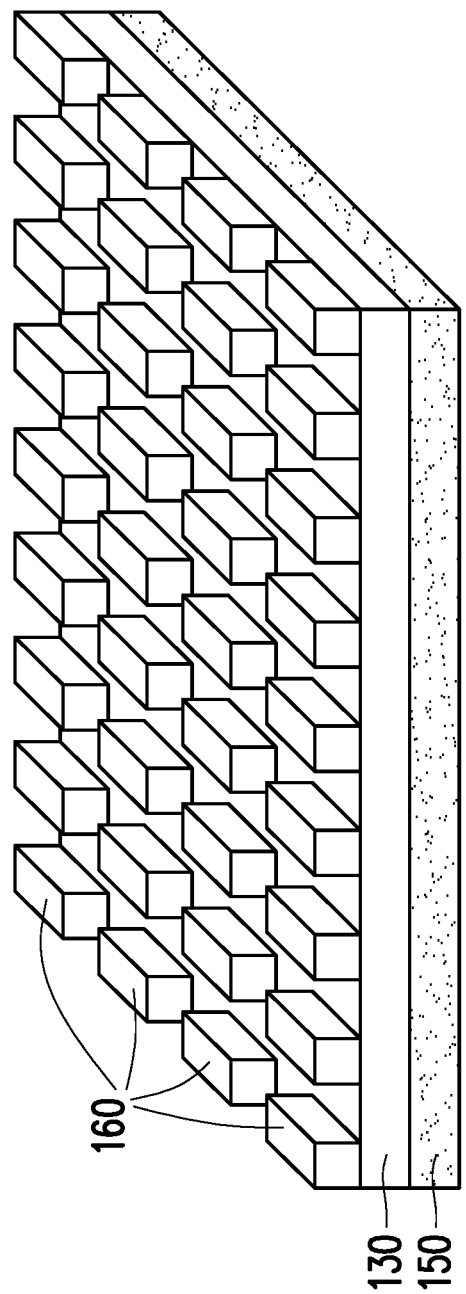
FIG. 3 is a three-dimensional schematic view of the electronic device of FIG. 2D.

First, with reference to FIG. 1 and FIG. 2A together, in a fabrication method of an electronic device 100 provided by this embodiment, step S1 is performed first. A circuit structure layer 130 is disposed (or arranged) on a carrier substrate 110 and a release layer 120, the circuit structure layer 130 and the carrier substrate 110 is located at two opposite sides of the release layer 120. In other embodiments, a release layer s disposed (or arranged) on the carrier substrate before arranging the circuit structure layer on the carrier substrate. In other embodiments, the release layer 120 may selectively be not disposed. In some embodiments, a seed layer (not shown) is located between the circuit structure layer 130 and the release layer 120, and a material of the seed layer includes titanium (Ti), copper (Cu), other suitable material or a combination of the above. In this embodiment, the carrier substrate 110 may include a rigid substrate. For instance, a material of the carrier substrate 110 may include but not limited to glass, quartz, sapphire, ceramic, other suitable substrate materials, or a combination of the above. In this embodiment, the release layer 120 may be formed of a polymer-based material, but it is not limited. The polymer-based material and the carrier substrate 110 may be removed in the following steps. In some embodiments, the release layer 120 may include an epoxy resin-based heat release material which may lose its adhesive property when being heated, such as a light-to-heat-conversion (LTHC) release coating layer. In other embodiments, the release layer 120 may include ultra-violet (UV) glue which may lose its adhesive property when being exposed to UV light.

In some embodiments, the circuit structure layer 130 has a first side 130a and a second side 130b opposite to the first side 130a. The first side 130a of the circuit structure layer 130 is away from the release layer 120 or the carrier substrate 110, and the second side 130b of the circuit structure layer 130 faces the release layer 120 or the carrier substrate 110. In some embodiments, the circuit structure layer 130 may be a redistribution layer (RDL). The circuit structure layer 130 may include a plurality of dielectric layers 131, a plurality of circuit layers 132, a plurality of conductive vias 133, a plurality of first conductive pads 134 located at the first side 130a, and/or a plurality of second conductive pads 135 located at the second side 130b. The dielectric layers 131 and the circuit layers 132 are stacked on the release layer 120 and/or the seed layer. In some embodiments, the conductive vias 133 penetrate through at least one dielectric layer 131 to be electrically connected to the circuit layers 132. In other words, the first conductive pads 134 and the second conductive pads 135 are located at two opposite sides of the circuit structure layer 130. In some embodiments, the first conductive pads 134 may be electrically connected to the circuit layers 132 through the conductive vias 133, and the second conductive pads 135 may also be electrically connected to the circuit layers 132 through the conductive vias 133. In other words, the first conductive pads 134 may be electrically connected to the second conductive pads 135 through the conductive vias 133 and the circuit layers 132.

In this embodiment, a distance D1 between two adjacent ones of the plurality of first conductive pads 134, a distance D2 and/or a distance D3 between two adjacent ones of the plurality of second conductive pads 135. The distance D1 is less than the distance D2 and/or distance D3. The circuit structure layer 130 may be a vertical fan-out circuit structure layer.

Figure 2B:
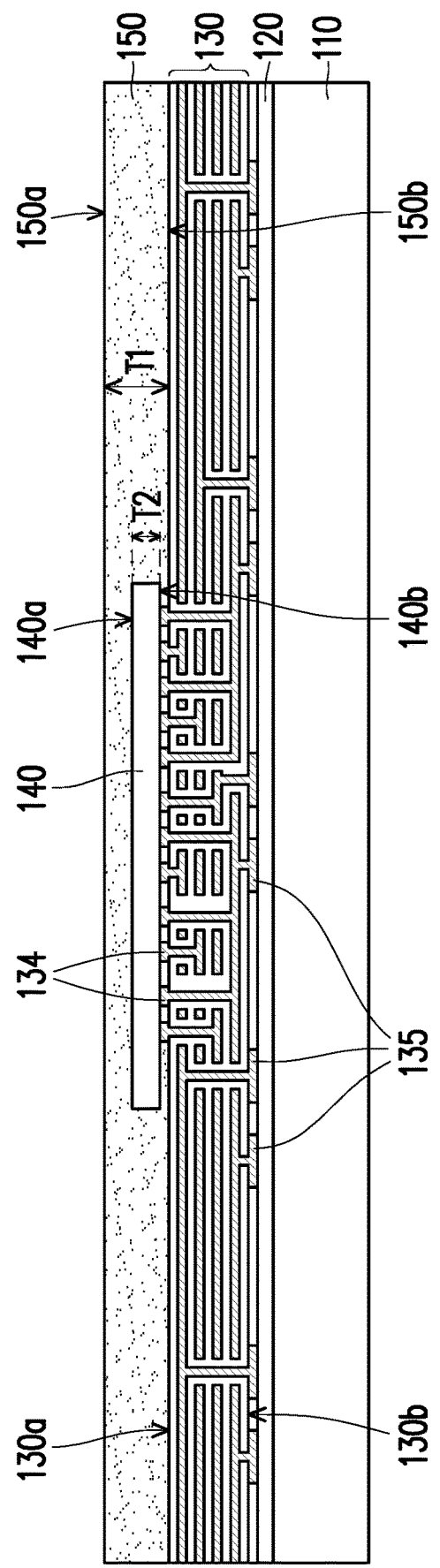

Next, with reference to FIG. 1 and FIG. 2B together, step S2 is performed, an electronic element 140 is disposed (or arranged) on the first side 130a of the circuit structure layer 130. The electronic element 140 is disposed on the plurality of first conductive pads 134 of the circuit structure layer 130 and is electrically connected to the circuit structure layer 130 through the plurality of first conductive pads 134. In some embodiments, a back surface 140a of the electronic element 140 faces away from the circuit structure layer 130 (and/or the first conductive pads 134), and a surface 140b of the electronic element 140 faces the circuit structure layer 130 (and/or the first conductive pads 134). That is, the electronic element 140 may be disposed on the first side 130a of the circuit structure layer 130 in a flip-chip manner, but it is not limited. In some embodiments, the electronic element 140 includes an active element. For instance, the electronic element 140 includes a switch element, a driver circuit, and/or other circuits, but it is not limited. A material of the electronic element 140 includes monocrystalline silicon or polycrystalline silicon, but it is not limited. In some embodiments, the electronic element 140 may include a Si-based complementary metal-oxide-semiconductor driver IC (Si-base CMOS driver IC), but it is not limited. In some embodiments, the electronic element 140 includes a die. In other embodiments, a plurality of the electronic elements 140 may be disposed on the first conductive pads 134 of the circuit structure layer 130, and the electronic elements 140 may be electrically connected to the first conductive pads 134.

Next, with reference to FIG. 1 and FIG. 2B together, step S3 is performed. A package structure 150 is disposed (or arranged) on the electronic element 140 and the first side 130a of the circuit structure layer 130, the electronic element 140 to be embedded or encapsulated in the package structure 150. To be specific, the package structure 150 covers the electronic element 140 and at least a portion of the first side 130a of the circuit structure layer 130, but not limited The package structure 150 may fill in or be disposed in a gap between the electronic element 140 and the circuit structure layer 130 (e.g., the first conductive pads 134) to improve bonding between the electronic element 140 and the circuit structure layer 130. In some embodiments, an underfill (not shown) or other suitable materials may be used to replace a portion of the package structure 150 to fill in or be disposed in the gap between the electronic element 140 and the circuit structure layer 130, but it is not limited. In some embodiments, the package structure 150 may include a molding material such as an epoxy molding compound (EMC), but it is not limited. For instance, a material of the package structure 150 includes but not limited to epoxy adhesive resin, a silicon dioxide filler, an additive, other suitable materials, or a combination of the above. In some embodiments, the package structure 150 includes a single layer structure or a composite layer structure.

In some embodiments, the package structure 150 has a first thickness T1, and the first thickness T1 may be defined by a distance between a first surface 150a (a surface away from the circuit structure layer 130) and a second surface 150b (a surface adjacent to the circuit structure layer 130) of the package structure 150. The electronic element 140 has a second thickness T2, and the second thickness T2 may be defined by a distance between the back surface 140a (a surface away from the circuit structure layer 130) and the surface 140b (a surface adjacent to the circuit structure layer 130) of the electronic element 140. In some embodiments, the first thickness T1 is greater than the second thickness T2 (first thickness T1>second thickness T2). In some embodiments, the first thickness T1 is greater than or equal to 1.5 times the second thickness T2 (first thickness T1≥1.5× second thickness T2) or the first thickness T1 is greater than or equal to 2 times the second thickness T2 (first thickness T1≥2×second thickness T2). As such, the package structure 150 may act as a support base of the electronic device 100, and other substrates configured for supporting are not required to be disposed in the electronic device 100, but the disclosure is not limited thereto.

Figure 2C:
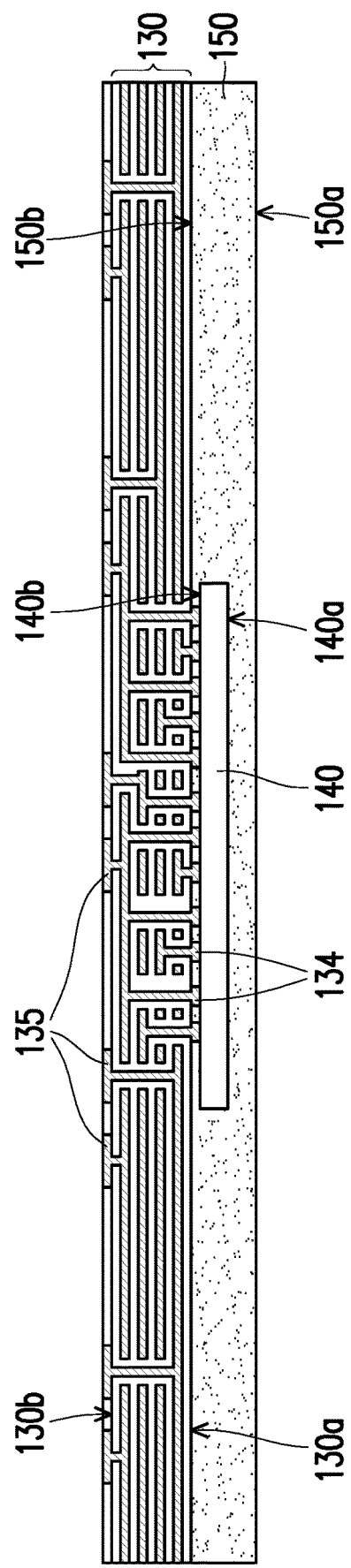

Next, with reference to FIG. 1, FIG. 2B, and FIG. 2C together, step S4 is performed. After the package structure 150 is disposed on the electronic element 140 and the first side 130a of the circuit structure layer 130, the carrier substrate 110 and/or the release layer 120 is removed to expose the second side 130b of the circuit structure layer 130 and/or the second conductive pads 135. In some embodiments, the release layer 120 and the carrier substrate 110 are removed by but not limited to laser. In some embodiments, the release layer 120 and the carrier substrate 110 are removed through the same or different methods. In some embodiments, the release layer 120 and the carrier substrate 110 are removed in the same or different steps. FIG. 2C is a state after the release layer 120 and/or the carrier substrate 110 is removed and the structure is turned upside down. Herein, the package structure 150 may act as the support base of the electronic device 100, and other substrates configured for supporting are not required, but the disclosure is not limited thereto.

Figure 2D:
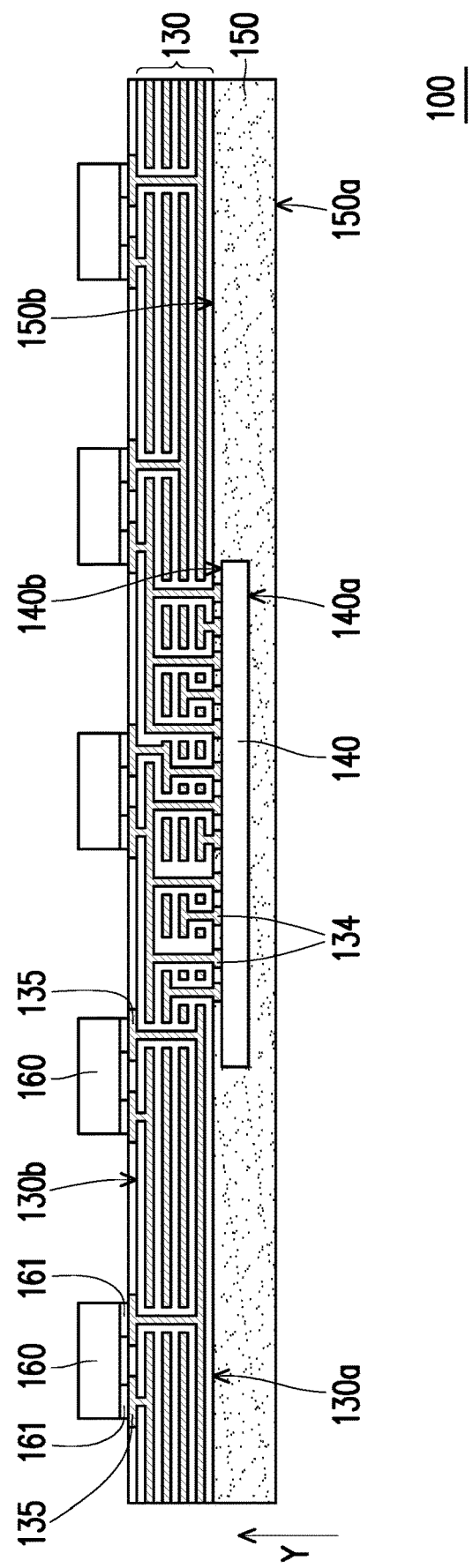

Next, with reference to FIG. 1, FIG. 2D, and FIG. 3 together, step S5 is performed. A plurality of function elements 160 are disposed (or arranged) on the second side 130b of the circuit structure layer 130, and the plurality of function elements 160 are electrically connected to the electronic element 140 through the circuit structure layer 130. To be specific, the pads 161 of the plurality of function elements 160 are disposed on the second conductive pads 135 of the circuit structure layer 130, and the plurality of function elements 160 (e.g., the pads 161) may be electrically connected to the circuit structure layer 130 through the plurality of second conductive pads 135.

Herein, the electronic element 140 and the circuit structure layer 130, at least one of plurality of the function elements 160 are overlapped in a normal direction Y (i.e., a direction perpendicular to the package structure 150) of the electronic device 100. Besides, the electronic element 140 and the function elements 160 are disposed at two opposite sides of the circuit structure layer 130, the function elements 160 may be electrically connected to the electronic element 140 vertically through the circuit structure layer 130. That is, a signal provided by the electronic element 140 may be transmitted to the function elements 160 vertically through the circuit structure layer 130 to control the function elements 160.

Next, as shown in FIG. 3, the function elements 160 may be arranged on the circuit structure layer 130 in a matrix, but it is not limited. In some embodiments, one of the plurality of function elements 160 may include a light emitting element or a sensing element, but it is not limited. For instance, the light emitting element includes the light emitting diodes (LEDs) of different colors, such as a red LED, a green LED, a blue LED, and/or a white LED, but it is not limited. The light emitting element may include a blue LED or an UV LED with a light conversion material, and the light conversion material may include a QD, fluorescence, phosphor, other suitable materials, or a combination of the above, but it is not limited. As such, in this embodiment, a region provided with the function elements 160 may be defined as a function region of the electronic device 100, and the function region may include a display surface, a light emitting surface, and a sensing surface, for example.

In short, the electronic device 100 provided by this embodiment includes the circuit structure layer 130, the package structure 150, the electronic element 140, and the function elements 160. The circuit structure layer 130 has the first side 130a and the second side 130b opposite to the first side 130a. The package structure 150 is disposed on the first side 130a of the circuit structure layer 130. The electronic element 140 is embedded or encapsulated in the package structure 150. The function elements 160 are disposed on the second side 130b of the circuit structure layer 130. The function elements 160 are electrically connected to the electronic element 140 through the circuit structure layer 130. Besides, the electronic element 140 and the function elements 160 in the electronic device 100 are disposed at two opposite sides of the circuit structure layer 130, the function elements 160 may be electrically connected to the electronic element 140 vertically (i.e., the normal direction Y of the electronic device 100) through the circuit structure layer 130. Therefore, compared to an existing electronic device is which the peripheral circuit region (i.e., the border) of the function surface (e.g., the display surface) is required to be disposed in the electronic element, the electronic device 100 provided by this embodiment exhibits a borderless (or narrow border) design or has a large function surface (e.g., a display surface) In addition, in the fabrication method of the electronic device 100 provided by this embodiment, the electronic element 140 is disposed on the circuit structure layer 130 after the circuit structure layer 130 is fabricated. In this way, compared to an electronic device in which the circuit structure layer is fabricated after the electronic element is disposed, the problem of waste of the electronic element 140 may be improved through the fabrication method of the electronic device 100.

In addition, although one electronic element 140 is shown in the electronic device 100, the disclosure is not limit a number of the electronic element. In some embodiments, the number of the electronic element in the electronic device may be two or greater than two. Accordingly, different electronic elements may be used to be electrically connected to different function elements, and that the different electronic elements may control different function elements.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 4:
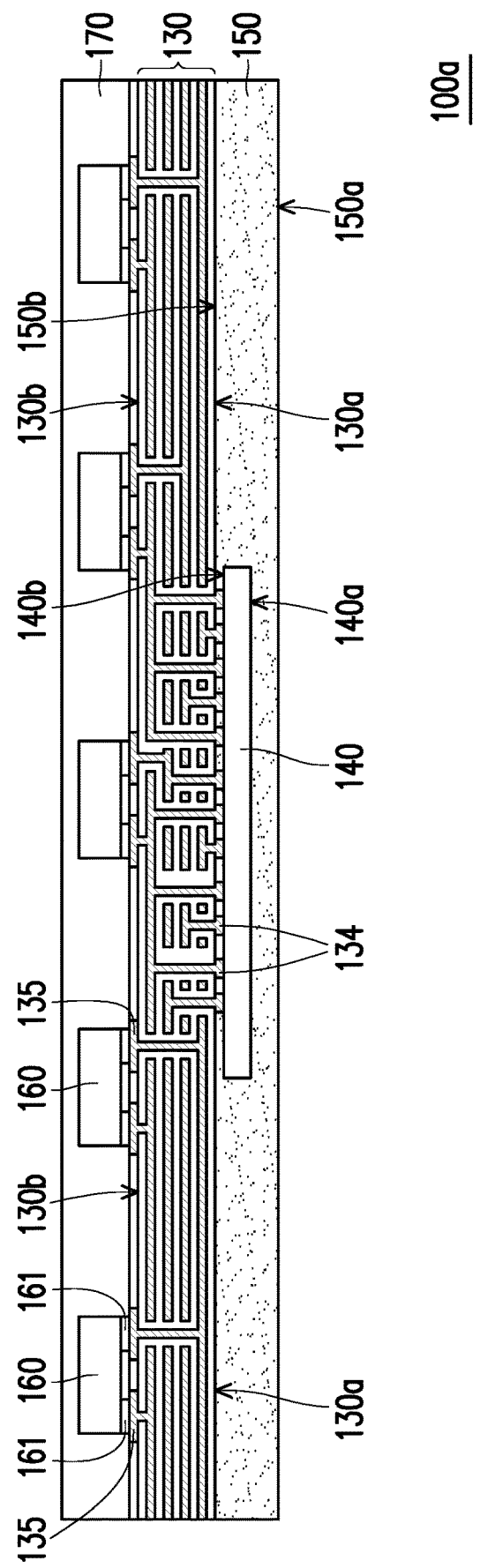
FIG. 4 is a cross-sectional schematic view of an electronic device according to another embodiment of the disclosure.

FIG. 4 is a cross-sectional schematic view of an electronic device according to another embodiment of the disclosure. With reference to FIG. 2D and FIG. 4 together, an electronic device 100a provided by this embodiment is similar to the electronic device 100 in FIG. 2D, so that description of identical or similar members in the two embodiments is not repeated. The difference between the electronic device 100a and the electronic device 100 is that the electronic device 100a further includes a protection layer 170. A material of the protection layer 170 includes a transparent material, a moisture or oxygen barrier material, or a combination of the above, but it is not limited. In some embodiments, a material of the protection layer 170 may include an organic material, an inorganic material, or a combination of the above, but it is not limited.

To be specific, with reference to FIG. 4, in this embodiment, the protection layer 170 may be disposed on the second side 130b of the circuit structure layer 130 and the plurality of function elements 160. In some embodiments, the protection layer 170 may cover the plurality of function elements 160 and/or at least a portion of the circuit structure layer 130 (e.g., the second side 130b). In some embodiments, the protection layer 170 may cover the plurality of second conductive pads.

In other embodiments (not shown), the protection layer 170 may expose the portions of the function elements 160 (e.g., surfaces of the function elements 160 away from the circuit structure layer 130) and/or the second side 130b of the circuit structure layer 130. In other embodiments (not shown) the protection layer 170 has to cover the pads 161 of the function elements 160 and the second conductive pads 135. The pads 161 and/or the second conductive pads 135 are protected through the protection layer 170, the pads 161 and/or the second conductive pads 135 may not be corroded by water and oxygen.

Figure 5:
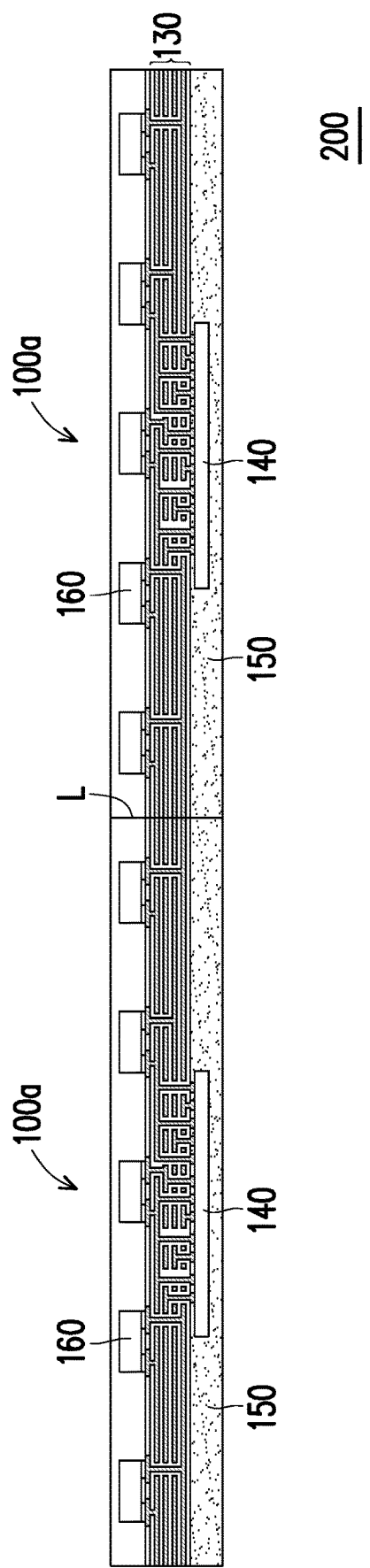
FIG. 5 is a cross-sectional schematic view of an electronic device according to another embodiment of the disclosure.

FIG. 5 is a cross-sectional schematic view of an electronic device according to another embodiment of the disclosure. With reference to FIG. 4 and FIG. 5 together, an electronic device 200 is similar to the electronic device 100a in FIG. 4, so that description of identical or similar members in the two embodiments is not repeated. The difference between the electronic device 200 and the electronic device 100a is that the electronic device 200 includes a plurality of electronic devices 100a (FIG. 5 depicts 2 electronic devices 100a, but it is not limited). To be specific, with reference to FIG. 5, in the electronic device 200, a plurality of electronic devices 100a are spliced together through a seamless splicing manner. A splicing line L is a splicing position of adjacent electronic devices 100a. In other embodiments (not shown), several splicing seams may be located between the electronic devices 100a, and attachment structures (or protection structures) may be selectively disposed in the splicing seams for fixing or protecting adjacent electronic devices 100a.

In view of the above, in the electronic device and the fabrication method thereof provided by the embodiments of the disclosure, the electronic element is embedded or encapsulated in the package structure. Further, the electronic element and the function elements are disposed at two opposite sides of the circuit structure layer, the function elements may be electrically connected to the electronic element vertically (i.e., the normal direction of the electronic device) through the circuit structure layer. Therefore, compared to an existing electronic device is which the peripheral circuit region (i.e., the border) of the function surface (e.g., the display surface) is required to be disposed in the electronic element, the electronic device provided by this embodiment exhibits a borderless (or narrow border) design or has a large function surface (e.g., a display surface) In addition, in the fabrication method of the electronic device provided by the disclosure, the electronic element is disposed on the circuit structure layer 130 after the circuit structure layer is disposed. In this way, compared to an existing electronic device in which the circuit structure layer is disposed after the electronic element is disposed, the problem of waste of the electronic element may be improved through the fabrication method of the electronic device.

It will be apparent to those skilled in the art that various modifications and variations can be made to the disclosed embodiments without departing from the scope or spirit of the disclosure. In view of the above, it is intended that the disclosure covers modifications and variations provided that they fall within the scope of the following claims and their equivalents.

What is claimed is:

1. An electronic device, comprising:
   a circuit structure layer, having a first side and a second side opposite to the first side;
   a package structure, disposed on the first side of the circuit structure layer and having a first thickness;
   an electronic element, embedded in the package structure and having a second thickness; and
   a plurality of function elements, disposed on the second side of the circuit structure layer and electrically connected to the electronic element through the circuit structure layer,
   wherein the first thickness of the package structure is greater than or equal to 1.5 times the second thickness of the electronic element, and the package structure includes a single layer structure.

2. The electronic device according to claim 1, wherein the package structure acts as a support base of the electronic device.

3. The electronic device according to claim 1, wherein one of the plurality of function elements comprises a light emitting element or a sensing element.

4. The electronic device according to claim 1, wherein the electronic element, the circuit structure layer, and at least one of plurality of the function elements are overlapped in a normal direction of the electronic device.

5. The electronic device according to claim 1, wherein the circuit structure layer comprises a plurality of first conductive pads located at the first side and a plurality of second conductive pads located at the second side, and a distance between two adjacent ones of the plurality of first conductive pads is less than a distance between two adjacent ones of the plurality of second conductive pads.

6. The electronic device according to claim 5, wherein the electronic element is disposed on the plurality of first conductive pads and is electrically connected to the circuit structure layer through the plurality of first conductive pads.

7. The electronic device according to claim 5, wherein the plurality of function elements are disposed on the plurality of second conductive pads, and the plurality of function elements are electrically connected to the circuit structure layer through the plurality of second conductive pads.

8. The electronic device according to claim 5, further comprising:
   a protection layer, disposed on the second side of the circuit structure layer and covering the plurality of second conductive pads.

9. The electronic device according to claim 8, wherein the protection layer is disposed on the plurality of function elements and covers the plurality of function elements.

10. The electronic device according to claim 1, wherein the circuit structure layer is a redistribution layer.

11. The electronic device according to claim 1, wherein the electronic element is disposed on the first side of the circuit structure layer in a flip-chip manner.

12. A fabrication method of an electronic device, comprising:
    arranging a circuit structure layer on a carrier substrate, wherein the circuit structure layer has a first side and a second side opposite to the first side;
    arranging an electronic element having a second thickness on the first side of the circuit structure layer;
    arranging a package structure having a first thickness on the electronic element and the first side of the circuit structure layer, wherein the electronic element is embedded in the package structure; and
    arranging a plurality of function elements on the second side of the circuit structure layer, wherein the plurality of function elements are electrically connected to the electronic element through the circuit structure layer,
    wherein the first thickness of the package structure is greater than or equal to 1.5 times the second thickness of the electronic element, and the package structure includes a single layer structure.

13. The fabrication method of the electronic device according to claim 12, further comprising:
    removing the carrier substrate to expose the second side of the circuit structure layer.

14. The fabrication method of the electronic device according to claim 12, wherein the package structure acts as a support base of the electronic device.

15. The fabrication method of the electronic device according to claim 12, wherein the circuit structure layer comprises a plurality of first conductive pads located at the first side, and a plurality of second conductive pads located at the second side.

16. The fabrication method of the electronic device according to claim 15, wherein a distance between two adjacent ones of the plurality of first conductive pads is less than a distance between two adjacent ones of the plurality of second conductive pads.

17. The fabrication method of the electronic device according to claim 12, further comprising:
    arranging a release layer on the carrier substrate before arranging the circuit structure layer on the carrier substrate.

18. The fabrication method of the electronic device according to claim 12, further comprising:
    arranging a protection layer on the second side of the circuit structure layer.

* * * * *